(12) United States Patent
Catey et al.

(10) Patent No.: US 8,623,576 B2
(45) Date of Patent: Jan. 7, 2014

(54) TIME DIFFERENTIAL RETICLE INSPECTION

(75) Inventors: Eric Brian Catey, Danbury, CT (US); Nora-Jean Harned, Redding, CT (US); Yevgeniy Konstantinovich Shmarev, Lagrangeville, NY (US); Robert Albert Tharaldsen, Sherman, CT (US); Richard David Jacobs, Brookfield, CT (US)

(73) Assignee: ASML Holding N.V., Veldhoven (NL)

( * ) Notice: Subject to any disclaimer, the term of this patent is extended or adjusted under 35 U.S.C. 154(b) by 12 days.

(21) Appl. No.: 13/378,811

(22) PCT Filed: Jul. 16, 2010

(86) PCT No.: PCT/EP2010/060354
§ 371 (c)(1),
(2), (4) Date: Dec. 16, 2011

(87) PCT Pub. No.: WO2011/035946
PCT Pub. Date: Mar. 31, 2011

(65) Prior Publication Data
US 2012/0171600 A1    Jul. 5, 2012

Related U.S. Application Data

(60) Provisional application No. 61/245,511, filed on Sep. 24, 2009.

(51) Int. Cl.
*G03C 5/00*    (2006.01)
*G06K 9/00*    (2006.01)

(52) U.S. Cl.
USPC ............. 430/30; 430/5; 382/144; 356/237.3; 356/237.4; 356/237.5; 356/239.5

(58) Field of Classification Search
USPC ........... 430/5, 30; 382/144; 356/237.3, 237.4, 356/237.5, 239.5
See application file for complete search history.

(56) References Cited

U.S. PATENT DOCUMENTS

| | | |
|---|---|---|
| 6,614,520 B1 | 9/2003 | Bareket et al. |
| 2003/0048939 A1 | 3/2003 | Lehman |
| 2005/0166171 A1 | 7/2005 | Bartov |

FOREIGN PATENT DOCUMENTS

| | | |
|---|---|---|
| CN | 101452201 A | 6/2009 |
| JP | 10-246951 A | 9/1998 |
| WO | WO 00/70332 A1 | 11/2000 |
| WO | WO 2005/073806 A1 | 8/2005 |

OTHER PUBLICATIONS

Yen, S. M., et al., "Improving COO on KLA-Tencor Wafer Fab Reticle Inspections by Implementing Pixel Migration as New STARlight2+ Capability", Proceedings of SPIE—The International Society for Optical Engineering—Photomask and Next-Generation Lithography Mask Technology, vol. 7028, pp. 70282O-1 to 70282O-8 (2008).

International Search Report directed to related International Patent Application No. PCT/EP2010/060354, mailed Nov. 15, 2010, from the European Patent Office; 4 pages.

English-Language Abstract for Chinese Patent Publication No. 101452201 A, published Jun. 10, 2009; 1 pages.

International Preliminary Report on Patentability and Written Opinion of the International Searching Authority directed to related International Patent Application No. PCT/EP2010/060354, issued Mar. 27, 2012; 7 pages.

*Primary Examiner* — Christopher Young
(74) *Attorney, Agent, or Firm* — Sterne, Kessler, Goldstein & Fox P.L.L.C.

(57) ABSTRACT

Disclosed are systems and methods for time differential reticle inspection. Contamination is detected by, for example, determining a difference between a first signature of at least a portion of a reticle and a second signature, produced subsequent to the first signature, of the portion of the reticle.

18 Claims, 7 Drawing Sheets

TIME DIFFERENTIAL RETICLE INSPECTION

CROSS-REFERENCE TO RELATED APPLICATIONS

This application claims the benefit of U.S. provisional application 61/245,511 which was filed on Sep. 24, 2009, and which is incorporated herein in its entirety by reference.

BACKGROUND

1. Field of the Invention

The present invention generally relates to lithography, and more particularly to patterning device inspection.

2. Related Art

A lithographic apparatus is a machine that applies a pattern onto a substrate, usually onto a target portion of the substrate. A lithographic apparatus can be used, for example, in the manufacture of integrated circuits (ICs). In that instance, a patterning device, which is alternatively referred to as a mask or a reticle, can be used to create a circuit pattern formed on an individual layer of the IC. The pattern can be transferred onto the target portion (e.g., comprising part of, one, or several dies) of the substrate (e.g., a silicon wafer). Transfer of the pattern is typically via imaging the pattern onto a layer of radiation-sensitive material (resist) on the substrate. In general, a single substrate will contain a network of adjacent target portions that are patterned. Known lithographic apparatus include steppers, in which each individual target portion is irradiated by exposing an entire pattern onto the target portion at one time, and scanners, in which each target portion is irradiated by scanning the pattern through a radiation beam in a given direction (the "scanning" direction) while synchronously scanning the substrate parallel or anti-parallel to this direction. It is also possible to transfer the pattern from the patterning device to the substrate by imprinting the pattern onto the substrate.

To image smaller features, it has been proposed to use extreme ultraviolet radiation (EUV) as exposure radiation in a lithographic apparatus. EUV radiation needs the exposure radiation beam path in the apparatus to be evacuated to avoid absorption of the exposure radiation. EUV lithographic apparatus use a patterning device, such as a mask or a reticle, to impart a pattern into a beam of EUV radiation. Such patterning devices are highly susceptible to contamination, such as particulate contamination, which provides image defects in the pattern imparted into the EUV radiation beam. The image defects at least degrade, and in some cases, can destroy the performance of an IC manufactured with a contaminated reticle. The image defects reduce yield of the lithographic apparatus. Therefore, inspecting patterning devices for contamination is important to maintain and improve yield of the lithographic apparatus.

Conventionally, masks are inspected for contamination using two methods, absolute detection and a comparison technique. Absolute detection measures a scattered signal from a probe beam. Analysis of the scattered signal may indicate a particular type and size of particulate contamination. However, absolute detection is not able to accurately distinguish between a signal produced by scattering from a reticle pattern and a signal produced by scattering from contamination on the reticle pattern. This problem occurs because contamination can be composed of any material having dimensions down to a molecular level, which unfortunately includes dimensions of a reticle's absorber structures. As a result, when using absolute detection, a scattered signal from a particle on the reticle's surface is indistinguishable from a signal scattered by the reticle's absorber structures. Thus, absolute detection is often relegated to inspecting non-patterned surfaces, such as a back-side of a reticle or a pellicle.

Another conventional method for reticle inspection uses comparison techniques. Comparison techniques include two common methods for inspecting patterned surfaces of a reticle. The first traditional comparison technique is commonly known as "die-to-die" comparison. This technique contemporaneously compares a first pattern on a substrate to a second pattern, similar to the first pattern, that is also located on the substrate. This technique essentially compares a first optical signal from a first pattern on the reticle with a second optical signal from a second pattern on the same reticle. Problems with this technique include that it cannot be performed when the reticle contains only one pattern or only a collection of unique patterns. Further, variations in absorber structure sizes and variations in critical dimensions between the first and second patterns can complicate the particle detection process and undesirably limit inspection accuracy.

The second conventional comparison technique compares a pattern on a tangible reticle with a computer-generated theoretical reticle layout design from which the tangible reticle was fabricated. Problems with this technique include that errors in a reticle fabrication process, such as those stemming from critical dimension control, are not represented in the computer-generated theoretical reticle layout design. These errors complicate the comparison technique by indicating differences between the tangible reticle and the computer-generated theoretical reticle layout design that are false positive indications of contamination. Thus, this comparison technique inherently produces errors that complicate the particle detection process and undesirably limit inspection accuracy.

Therefore, the conventional systems and methods for inspecting a reticle suffer from significant disadvantages.

SUMMARY

This section is for the purpose of summarizing some aspects of the present invention and to briefly introduce some preferred embodiments. Simplifications or omissions may be made to avoid obscuring the purpose of the section. Such simplifications or omissions are not intended to limit the scope of the present invention. Consistent with the principles of the present invention as embodied and broadly described herein, the present invention includes improved reticle inspection systems and methods. To meet these needs, embodiments of the present invention are directed toward time differential reticle inspection. For example, an embodiment provides a method for detecting contamination on a reticle using a time differential technique. In this embodiment, presence of a difference between a first signature of a portion of the reticle and a second signature, produced subsequent to the first signature, of the portion of the reticle is determined. A significant difference between the first and second signatures indicates a presence of contamination on the reticle. If there are no significant differences, then the reticle is considered to be clean. In this embodiment, the first signature can be measured when the reticle is in a known clean condition.

As a further example, another embodiment provides a method for detecting contamination on a reticle. A first signature of a portion of the reticle is recorded. Then the portion of the reticle is exposed to form a wafer image. The wafer image is inspected to detect an error. If an error is detected, the first signature is erased and the reticle is rejected as contaminated. If no error is detected in the wafer image, then the portion of the reticle is subsequently inspected to produce a second signature. A difference between the first signature and the second signature is determined, to detect contamination on the reticle. If contamination is detected, the reticle can be cleaned.

In yet another exemplary embodiment, there is provided a method for detecting contamination on a reticle. A first signature of a portion of the reticle is recorded at a time when the reticle meets a minimum level of cleanliness necessary to produce a functional integrated circuit layer. After the recording, the portion of the reticle is inspected to produce a second signature. A difference between the first signature and the second signature is determined, to detect contamination on the reticle. If contamination is detected, the reticle can be cleaned.

Further features and advantages of the invention, as well as the structure and operation of various embodiments of the invention, are described in detail below with reference to the accompanying drawings. It is noted that the invention is not limited to the specific embodiments described herein. Such embodiments are presented herein for illustrative purposes only. Additional embodiments will be apparent to persons skilled in the relevant art(s) based on the teachings contained herein.

BRIEF DESCRIPTION OF THE DRAWINGS/FIGURES

The accompanying drawings, which are incorporated herein and form part of the specification, illustrate the present invention and, together with the description, further serve to explain the principles of the invention and to enable a person skilled in the relevant art(s) to make and use the invention.

FIGS. 1A and 1B respectively depict reflective and transmissive lithographic apparatuses.

Figure 1A:
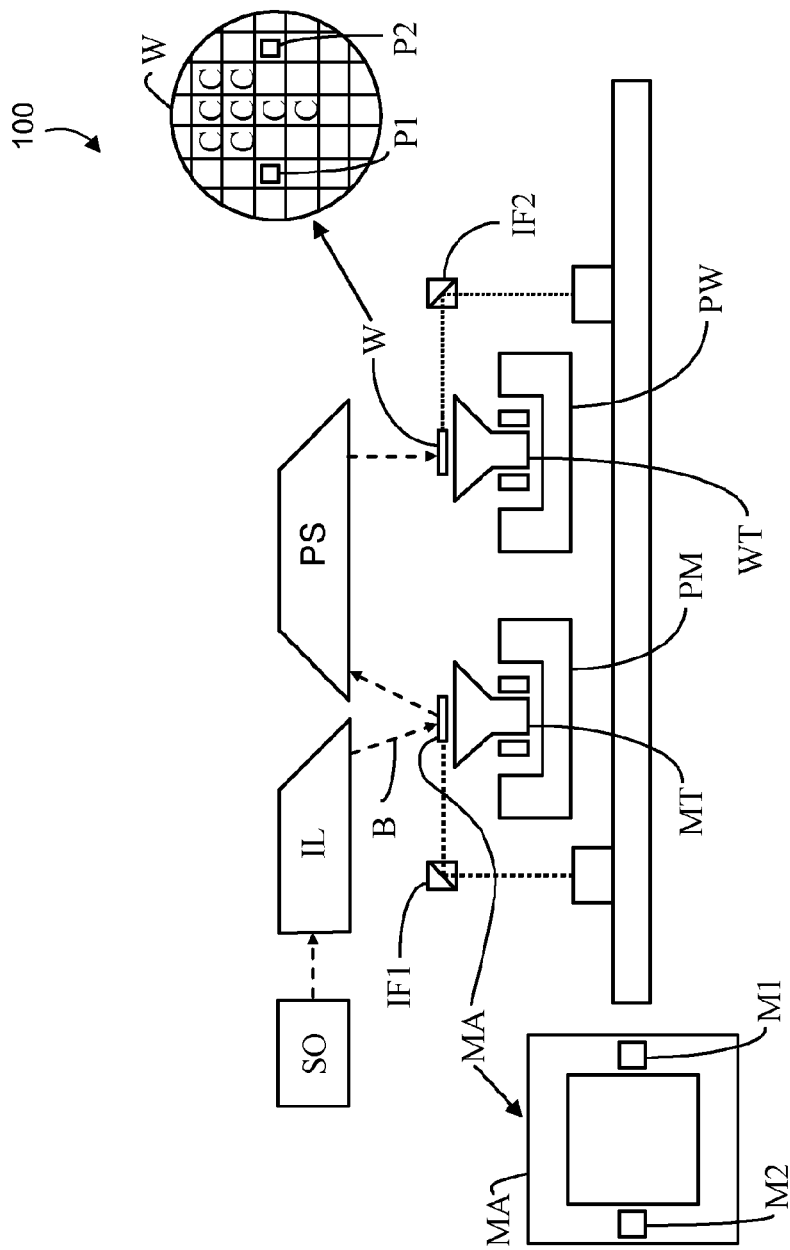

The features and advantages of the present invention will become more apparent from the detailed description set forth below when taken in conjunction with the drawings, in which like reference characters identify corresponding elements throughout. In the drawings, like reference numbers generally indicate identical, functionally similar, and/or structurally similar elements. The drawing in which an element first appears is indicated by the leftmost digit(s) in the corresponding reference number.

DETAILED DESCRIPTION

I. Overview

The invention will be better understood from the following descriptions of various "embodiments" of the invention. Thus, specific "embodiments" are views of the invention, but each does not itself represent the whole invention. In many cases individual elements from one particular embodiment may be substituted for different elements in another embodiment carrying out a similar or corresponding function. The present invention relates to time differential reticle inspection methods and apparatus. This specification discloses one or more embodiments that incorporate the features of this invention. The disclosed embodiment(s) merely exemplify the invention. The scope of the invention is not limited to the disclosed embodiment(s). The invention is defined by the claims appended hereto.

The embodiment(s) described, and references in the specification to "one embodiment", "an embodiment", "an example embodiment", etc., indicate that the embodiment(s) described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is understood that it is within the knowledge of one skilled in the art to effect such feature, structure, or characteristic in connection with other embodiments, whether or not explicitly described.

Features of embodiments of the invention may be implemented in hardware, firmware, software, or any combination thereof. Features of embodiments of the invention may also be implemented as instructions stored on a machine-readable medium, which may be read and executed by one or more processors. A machine-readable medium may include any mechanism for storing or transmitting information in a form readable by a machine (e.g., a computing device). For example, a machine-readable medium may include read only memory (ROM); random access memory (RAM); magnetic disk storage media; optical storage media; flash memory devices; electrical, optical, acoustical or other forms of propagated signals (e.g., carrier waves, infrared signals, digital signals, etc.), and others. Further, firmware, software, routines, instructions may be described herein as performing certain actions. However, it should be appreciated that such descriptions are merely for convenience and that such actions in fact result from computing devices, processors, controllers, or other devices executing the firmware, software, routines, instructions, etc.

Disclosed are systems and methods for time differential reticle inspection. Contamination on a reticle is detected by, for example, determining a difference between a first signature of a portion of a reticle and a second signature, produced subsequent to the first signature, of the portion of the reticle. Measurement of the first and second signatures is not contemporaneous. In the time between measuring the first and second signatures, the reticle can be stored in a library and/or can be used in a lithographic apparatus to fabricate integrated devices.

In this example, the first signature can be measured when the reticle is in a known clean condition, such as at a time when the reticle meets a minimum level of cleanliness necessary to produce a functional integrated circuit layer. Thus, if there is a significant difference between the first and second signatures, this difference indicates a presence of contamination on the reticle. If there are no significant differences, then the reticle is considered to be clean. If contamination on the reticle is detected, the reticle can be cleaned.

Before describing such embodiments in more detail, however, it is instructive to present an example environment in which embodiments of the present invention may be implemented.

II. An Example Lithographic Environment

A. Example Reflective and Transmissive Lithographic Systems

Figure 1B:
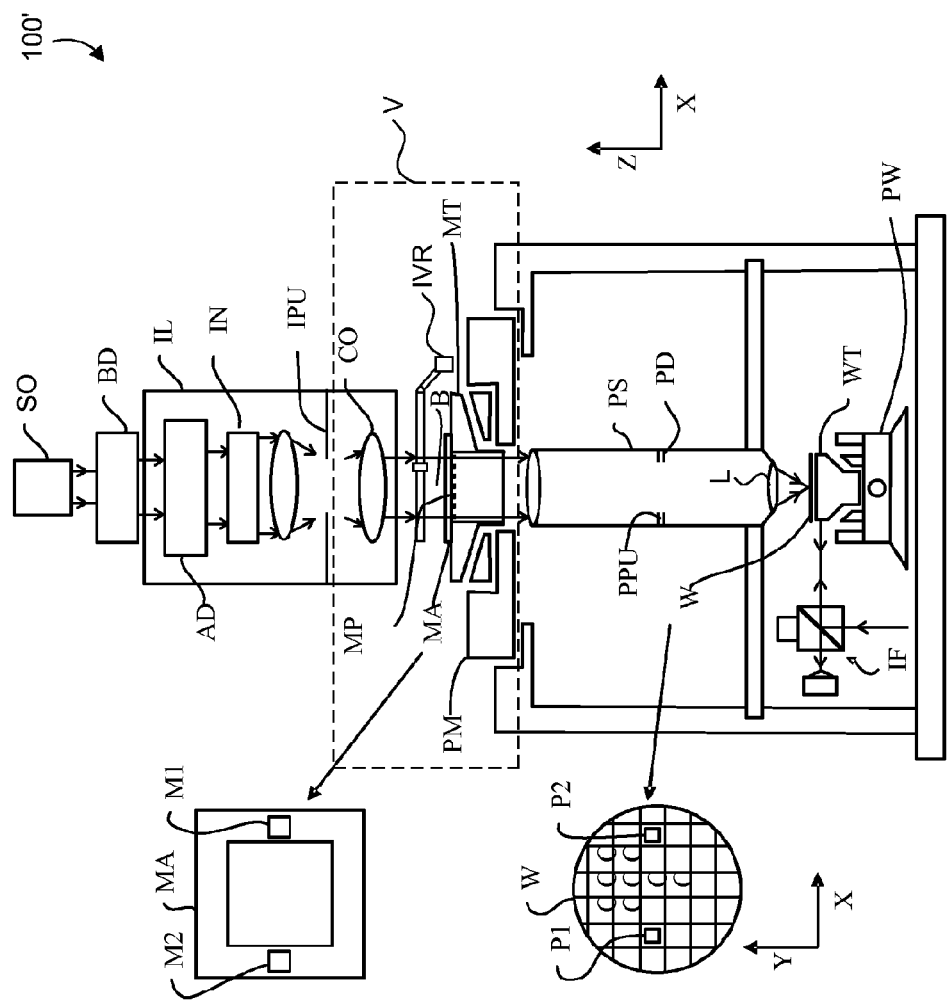

FIGS. 1A and 1B schematically depict lithographic apparatus 100 and lithographic apparatus 100', respectively. Lithographic apparatus 100 and lithographic apparatus 100' each include: an illumination system (illuminator) IL configured to condition a radiation beam B (e.g., DUV or EUV radiation) provided by a source SO; a support structure (e.g., a mask table) MT configured to support a patterning device (e.g., a mask, a reticle, or a dynamic patterning device) MA and connected to a first positioner PM configured to accurately position the patterning device MA; and a substrate table (e.g., a wafer table) WT configured to hold a substrate (e.g., a resist coated wafer) W and connected to a second positioner PW configured to accurately position the substrate W. Lithographic apparatuses 100 and 100' also have a projection system PS configured to project a pattern imparted to the radiation beam B by patterning device MA onto a target portion (e.g., comprising one or more dies) C of the substrate W. In lithographic apparatus 100 the patterning device MA and the projection system PS are reflective, and in lithographic apparatus 100' the patterning device MA and the projection system PS are transmissive.

The illumination system IL can include various types of optical components, such as refractive, reflective, magnetic, electromagnetic, electrostatic, or other types of optical components, or any combination thereof, for directing, shaping, or controlling the radiation beam B.

The support structure MT holds the patterning device MA in a manner that depends on the orientation of the patterning device MA, the design of the lithographic apparatuses 100 and 100', and other conditions, such as for example whether or not the patterning device MA is held in a vacuum environment. The support structure MT can use mechanical, vacuum, electrostatic or other clamping techniques to hold the patterning device MA. The support structure MT can be a frame or a table, for example, which can be fixed or movable, as required. The support structure MT can ensure that the patterning device is at a desired position, for example with respect to the projection system PS.

The term "patterning device" MA should be broadly interpreted as referring to any device that can be used to impart a radiation beam B with a pattern in its cross-section, such as to create a pattern in the target portion C of the substrate W. The pattern imparted to the radiation beam B can correspond to a particular functional layer in a device being created in the target portion C, such as an integrated circuit.

The patterning device MA can be transmissive (as in lithographic apparatus 100' of FIG. 1B) or reflective (as in lithographic apparatus 100 of FIG. 1A). Examples of patterning devices MA include reticles, masks, programmable mirror arrays, and programmable LCD panels. Masks are well known in lithography, and include mask types such as binary, alternating phase shift, and attenuated phase shift, as well as various hybrid mask types. An example of a programmable mirror array employs a matrix arrangement of small mirrors, each of which can be individually tilted so as to reflect an incoming radiation beam in different directions. The tilted mirrors impart a pattern in the radiation beam B which is reflected by the mirror matrix.

The term "projection system" PS can encompass any type of projection system, including refractive, reflective, catadioptric, magnetic, electromagnetic and electrostatic optical systems, or any combination thereof, as appropriate for the exposure radiation being used, or for other factors, such as the use of an immersion liquid or the use of a vacuum. A vacuum environment can be used for EUV or electron beam radiation since other gases can absorb, respectively, too much radiation or too many electrons. A vacuum environment can therefore be provided to the whole beam path with the aid of a vacuum wall and vacuum pumps.

Lithographic apparatus 100 and/or lithographic apparatus 100' can be of a type having two (dual stage) or more substrate tables (and/or two or more mask tables) WT. In such "multiple stage" machines the additional substrate tables WT can be used in parallel, or preparatory steps can be carried out on one or more tables while one or more other substrate tables WT are being used for exposure.

Referring to FIGS. 1A and 1B, the illuminator IL receives a radiation beam from a radiation source SO. The source SO and the lithographic apparatuses 100, 100' can be separate entities, for example when the source SO is an excimer laser. In such cases, the source SO is not considered to form part of the lithographic apparatuses 100 or 100', and the radiation beam B passes from the source SO to the illuminator IL with the aid of a beam delivery system BD (FIG. 1B) comprising, for example, suitable directing mirrors and/or a beam expander. In other cases, the source SO can be an integral part of the lithographic apparatuses 100, 100'—for example when the source SO is a mercury lamp. The source SO and the illuminator IL, together with the beam delivery system BD, if required, can be referred to as a radiation system.

The illuminator IL can comprise an adjuster AD (FIG. 1B) for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL can comprise various other components (FIG. 1B), such as an integrator IN and a condenser CO. The illuminator IL can be used to condition the radiation beam B, to have a desired uniformity and intensity distribution in its cross section.

Referring to FIG. 1A, the radiation beam B is incident on the patterning device (e.g., mask) MA, which is held on the support structure (e.g., mask table) MT, and is patterned by the patterning device MA. In lithographic apparatus 100, the radiation beam B is reflected from the patterning device (e.g., mask) MA. After being reflected from the patterning device (e.g., mask) MA, the radiation beam B passes through the projection system PS, which focuses the radiation beam B onto a target portion C of the substrate W. With the aid of the second positioner PW and position sensor IF2 (e.g., an interferometric device, linear encoder or capacitive sensor), the substrate table WT can be moved accurately, e.g. so as to position different target portions C in the path of the radiation beam B. Similarly, the first positioner PM and another position sensor IF1 can be used to accurately position the patterning device (e.g., mask) MA with respect to the path of the radiation beam B. Patterning device (e.g., mask) MA and substrate W can be aligned using mask alignment marks M1, M2 and substrate alignment marks P1, P2.

Referring to FIG. 1B, the radiation beam B is incident on the patterning device (e.g., mask MA), which is held on the support structure (e.g., mask table MT), and is patterned by the patterning device. Having traversed the mask MA, the radiation beam B passes through the projection system PS, which focuses the beam onto a target portion C of the substrate W. With the aid of the second positioner PW and position sensor IF (e.g., an interferometric device, linear encoder or capacitive sensor), the substrate table WT can be moved accurately, e.g. so as to position different target portions C in the path of the radiation beam B. Similarly, the first positioner PM and another position sensor (which is not explicitly depicted in FIG. 1B) can be used to accurately position the mask MA with respect to the path of the radiation beam B, e.g., after mechanical retrieval from a mask library, or during a scan. In general, movement of the mask table MT can be realized with the aid of a long-stroke module (coarse positioning) and a short-stroke module (fine positioning), which form part of the first positioner PM. Similarly, movement of the substrate table WT can be realized using a long-stroke module and a short-stroke module, which form part of the second positioner PW. In the case of a stepper (as opposed to a scanner) the mask table MT can be connected to a short-stroke actuator only, or can be fixed. Mask MA and substrate W can be aligned using mask alignment marks M1, M2 and substrate alignment marks P1, P2. Although the substrate alignment marks as illustrated occupy dedicated target portions, they can be located in spaces between target portions (known as scribe-lane alignment marks). Similarly, in situations in which more than one die is provided on the mask MA, the mask alignment marks can be located between the dies.

The lithographic apparatuses 100 and 100' can be used in at least one of the following modes:

1. In step mode, the support structure (e.g., mask table) MT and the substrate table WT are kept essentially stationary, while an entire pattern imparted to the radiation beam B is projected onto a target portion C at one time (i.e., a single static exposure). The substrate table WT is then shifted in the X and/or Y direction so that a different target portion C can be exposed.
2. In scan mode, the support structure (e.g., mask table) MT and the substrate table WT are scanned synchronously while a pattern imparted to the radiation beam B is projected onto a target portion C (i.e., a single dynamic exposure). The velocity and direction of the substrate table WT relative to the support structure (e.g., mask table) MT can be determined by the (de-)magnification and image reversal characteristics of the projection system PS.
3. In another mode, the support structure (e.g., mask table) MT is kept substantially stationary holding a programmable patterning device, and the substrate table WT is moved or scanned while a pattern imparted to the radiation beam B is projected onto a target portion C. A pulsed radiation source SO can be employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to herein.

Combinations and/or variations on the described modes of use or entirely different modes of use can also be employed.

Although specific reference can be made in this text to the use of lithographic apparatus in the manufacture of ICs, it should be understood that the lithographic apparatus described herein can have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein can be considered as synonymous with the more general terms "substrate" or "target portion," respectively. The substrate referred to herein can be processed, before or after exposure, in for example a track (a tool that typically applies a layer of resist to a substrate and develops the exposed resist), a metrology tool and/or an inspection tool. Where applicable, the disclosure herein can be applied to such and other substrate processing tools. Further, the substrate can be processed more than once, for example in order to create a multi-layer IC, so that the term substrate used herein can also refer to a substrate that already contains multiple processed layers.

In a further embodiment, lithographic apparatus 100 includes an extreme ultraviolet (EUV) source, which is configured to generate a beam of EUV radiation for EUV lithography. In general, the EUV source is configured in a radiation system (see below), and a corresponding illumination system is configured to condition the EUV radiation beam of the EUV source.

B. Example EUV Lithographic Apparatus

Figure 2:
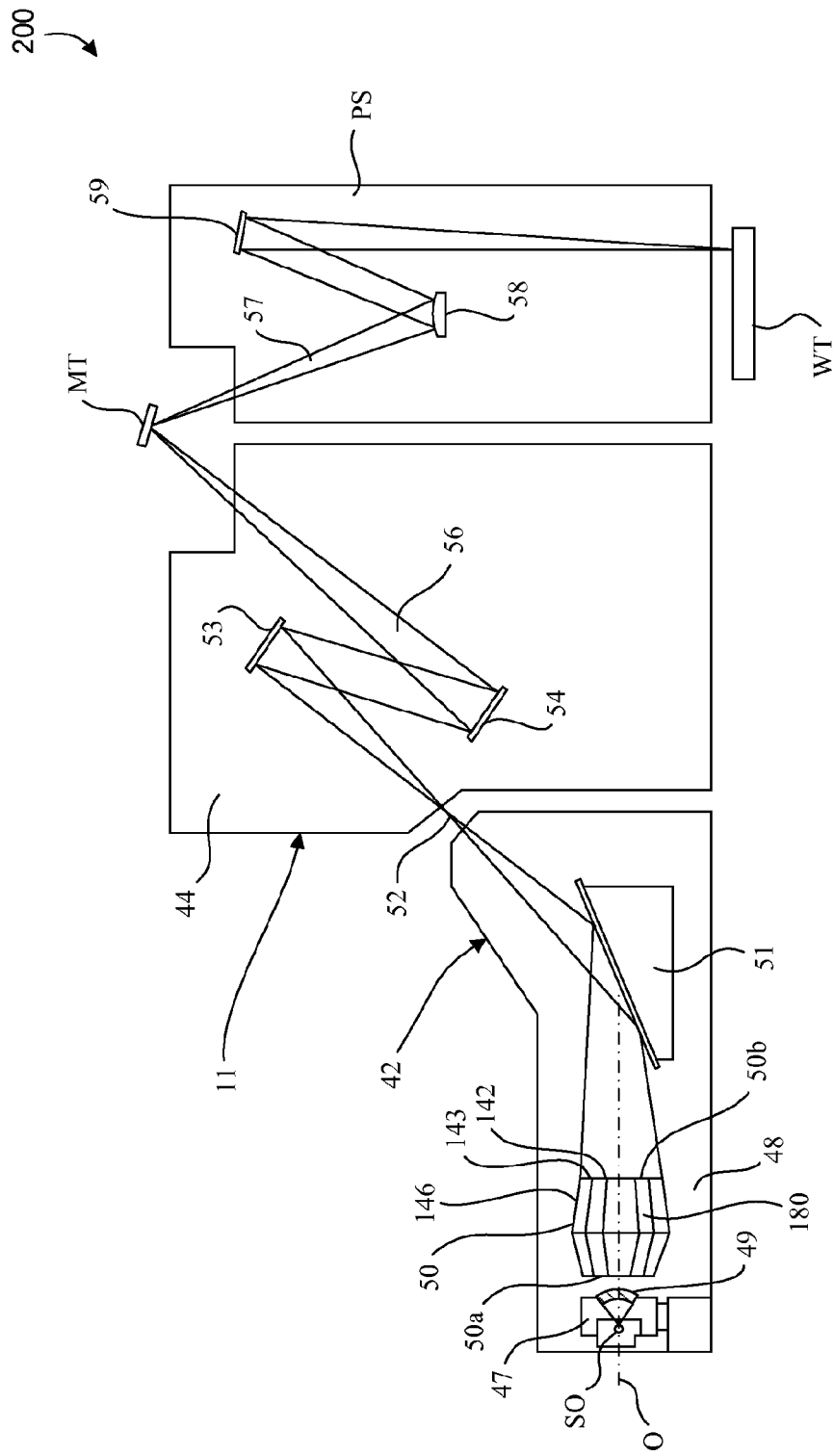
FIG. 2 depicts an example EUV lithographic apparatus.

FIG. 2 schematically depicts an exemplary EUV lithographic apparatus 200 according to an embodiment of the present invention. In FIG. 2, EUV lithographic apparatus 200 includes a radiation system 42, an illumination optics unit 44, and a projection system PS. The radiation system 42 includes a radiation source SO, in which a beam of radiation can be formed by a discharge plasma. In an embodiment, EUV radiation can be produced by a gas or vapor, for example, from Xe gas, Li vapor, or Sn vapor, in which a very hot plasma is created to emit radiation in the EUV range of the electromagnetic spectrum. The very hot plasma can be created by generating at least partially ionized plasma by, for example, an electrical discharge. Partial pressures of, for example, 10 Pa of Xe, Li, Sn vapor or any other suitable gas or vapor can be required for efficient generation of the radiation. The radiation emitted by radiation source SO is passed from a source chamber 47 into a collector chamber 48 via a gas barrier or contaminant trap 49 positioned in or behind an opening in source chamber 47.

In an embodiment, gas barrier 49 can include a channel structure.

Collector chamber 48 includes a radiation collector 50 (which can also be called a collector mirror or a collector) that can be formed from a grazing incidence collector. Radiation collector 50 has an upstream radiation collector side 50a and a downstream radiation collector side 50b, and radiation passed by collector 50 can be reflected off a grating spectral filter 51 to be focused at a virtual source point 52 at an aperture in the collector chamber 48.

From collector chamber 48, a beam of radiation 56 is reflected in illumination optics unit 44 via normal incidence reflectors 53 and 54 onto a reticle or mask (not shown) positioned on reticle or mask table MT. A patterned beam 57 is formed, which is imaged in projection system PS via reflective elements 58 and 59 onto a substrate (not shown) supported on wafer stage or substrate table WT. In various embodiments, illumination optics unit 44 and projection system PS can include more (or fewer) elements than depicted in FIG. 2. For example, grating spectral filter 51 can optionally be present, depending upon the type of lithographic apparatus. Further, in an embodiment, illumination optics unit 44 and projection system PS can include more mirrors than those depicted in FIG. 2. For example, projection system PS can incorporate one to four reflective elements in addition to reflective elements 58 and 59. In FIG. 2, reference number 180 indicates a space between two reflectors, e.g., a space between reflectors 142 and 143.

In an embodiment, collector mirror 50 can also include a normal incidence collector in place of or in addition to a grazing incidence mirror. Further, collector mirror 50, although described in reference to a nested collector with reflectors 142, 143, and 146, is herein further used as example of a collector.

Further, instead of a grating 51, as schematically depicted in FIG. 2, a transmissive optical filter can also be applied. Optical filters transmissive for EUV, as well as optical filters less transmissive for or even substantially absorbing UV radiation, are known to skilled artisans. Hence, the use of "grating spectral purity filter" is herein further indicated interchangeably as a "spectral purity filter," which includes gratings or transmissive filters. Although not depicted in FIG. 2, EUV transmissive optical filters can be included as additional optical elements, for example, configured upstream of collector mirror 50 or optical EUV transmissive filters in illumination unit 44 and/or projection system PS.

The terms "upstream" and "downstream," with respect to optical elements, indicate positions of one or more optical elements "optically upstream" and "optically downstream," respectively, of one or more additional optical elements. Following the light path that a beam of radiation traverses through lithographic apparatus 200, a first optical element closer to source SO than a second optical element is configured upstream of the second optical element; the second optical element is configured downstream of the first optical element. For example, collector mirror 50 is configured upstream of spectral filter 51, whereas optical element 53 is configured downstream of spectral filter 51.

All optical elements depicted in FIG. 2 (and additional optical elements not shown in the schematic drawing of this embodiment) can be vulnerable to deposition of contaminants produced by source SO, for example, Sn. Such can be the case for the radiation collector 50 and, if present, the spectral purity filter 51. Hence, a cleaning device can be employed to clean one or more of these optical elements, as well as a cleaning method can be applied to those optical elements, but also to normal incidence reflectors 53 and 54 and reflective elements 58 and 59 or other optical elements, for example additional mirrors, gratings, etc.

Radiation collector 50 can be a grazing incidence collector, and in such an embodiment, collector 50 is aligned along an optical axis O. The source SO, or an image thereof, can also be located along optical axis O. The radiation collector 50 can comprise reflectors 142, 143, and 146 (also known as a "shell" or a Wolter-type reflector including several Wolter-type reflectors). Reflectors 142, 143, and 146 can be nested and rotationally symmetric about optical axis O. In FIG. 2, an inner reflector is indicated by reference number 142, an intermediate reflector is indicated by reference number 143, and an outer reflector is indicated by reference number 146. The radiation collector 50 encloses a certain volume, i.e., a volume within the outer reflector(s) 146. Usually, the volume within outer reflector(s) 146 is circumferentially closed, although small openings can be present.

Reflectors 142, 143, and 146 respectively can include surfaces of which at least portion represents a reflective layer or a number of reflective layers. Hence, reflectors 142, 143, and 146 (or additional reflectors in the embodiments of radiation collectors having more than three reflectors or shells) are at least partly designed for reflecting and collecting EUV radiation from source SO, and at least part of reflectors 142, 143, and 146 can not be designed to reflect and collect EUV radiation. For example, at least part of the back side of the reflectors can not be designed to reflect and collect EUV radiation. On the surface of these reflective layers, there can in addition be a cap layer for protection or as optical filter provided on at least part of the surface of the reflective layers.

The radiation collector 50 can be placed in the vicinity of the source SO or an image of the source SO. Each reflector 142, 143, and 146 can comprise at least two adjacent reflecting surfaces, the reflecting surfaces further from the source SO being placed at smaller angles to the optical axis O than the reflecting surface that is closer to the source SO. In this way, a grazing incidence collector 50 is configured to generate a beam of (E)UV radiation propagating along the optical axis O. At least two reflectors can be placed substantially coaxially and extend substantially rotationally symmetric about the optical axis O. It should be appreciated that radiation collector 50 can have further features on the external surface of outer reflector 146 or further features around outer reflector 146, for example a protective holder, a heater, etc.

In the embodiments described herein, the terms "lens" and "lens element," where the context allows, can refer to any one or combination of various types of optical components, comprising refractive, reflective, magnetic, electromagnetic and electrostatic optical components.

Further, the terms "radiation" and "beam" used herein encompass all types of electromagnetic radiation, comprising ultraviolet (UV) radiation (e.g., having a wavelength $\lambda$ of 365, 248, 193, 157, or 126 nm), extreme ultra-violet (EUV or soft X-ray) radiation (e.g., having a wavelength in the range of approximately 5-20 nm, e.g., 13.5 nm), or hard X-ray working at less than 5 nm, as well as particle beams, such as ion beams or electron beams. Generally, radiation having wavelengths between about 780-3000 nm (or larger) is considered IR radiation. UV refers to radiation with wavelengths of approximately 100-400 nm. Within lithography, it is usually also applied to the wavelengths, which can be produced by a mercury discharge lamp: G-line 436 nm; H-line 405 nm; and/or I-line 365 nm. Vacuum UV, or VUV (i.e., UV absorbed by air), refers to radiation having a wavelength of approximately 100-200 nm. Deep UV (DUV) generally refers to radiation having wavelengths ranging from about 126 nm to about 428 nm, and in an embodiment, an excimer laser can generate DUV radiation used within lithographic apparatus. It should be appreciated that radiation having a wavelength in the range of, for example, about 5-20 nm relates to radiation with a certain wavelength band, of which at least a part is in the range of about 5-20 nm.

III. Time Differential Reticle Inspection

Disclosed are systems and methods to detect contamination on a reticle by time differential reticle inspection. A first and second signature are measured at different times to compare a region of the reticle to itself, at an earlier point in time, and thus identify contamination due to changes in the signatures. The first signature can be measured when the reticle is in a known clean condition, such as at a time when the reticle meets a minimum level of cleanliness necessary to produce a functional integrated circuit layer. Thus, if there is a significant difference between the first and second signatures, this difference indicates a presence of contamination on the reticle. If there are no significant differences between the first and second signatures, the reticle is considered to be clean.

Unlike absolute detection methods, the systems and methods described herein do not need to discriminate between contaminates and a reticle absorber structure. Also, unlike comparison methods, there is no need to have knowledge of the reticle pattern, either for purposes of comparison to a computer-generated theoretical reticle layout design from which the tangible reticle was fabricated, or for purposes of locating a similarly-patterned region. Moreover, any type of reticle pattern can be inspected using the methods described herein, so reticle pattern features whose dimensions are similar to those of particles, or whose uniqueness may prevent die-to-die comparison, can be inspected with this technique. This technique distinguishes between signals produced by the reticle's absorber and a signal produced by contaminants and thus, the technique identifies presence of contamination having physical dimensions substantially similar to those of absorber structures. Also, since each region of the reticle is compared with itself, critical dimension variation is not an issue, and this noise source is removed.

Figure 3:
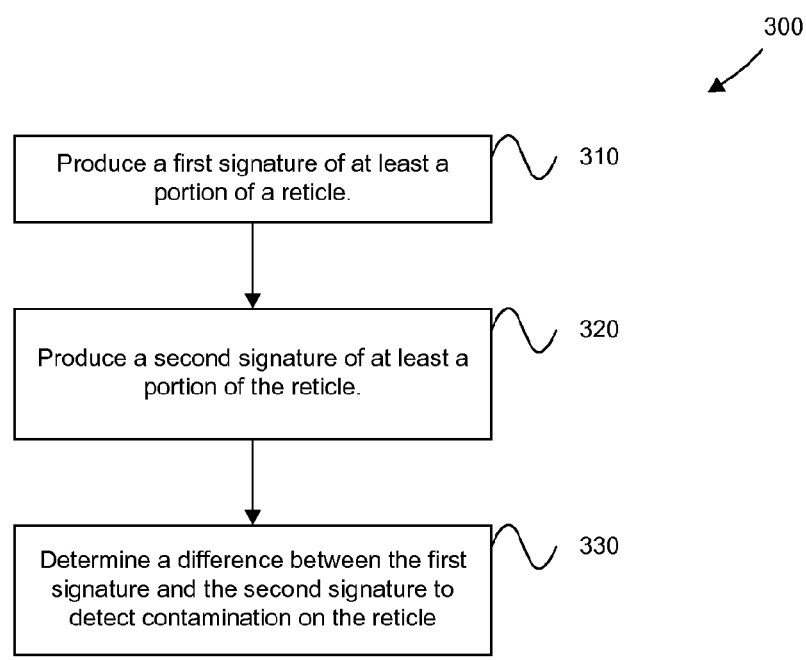
FIG. 3 depicts a flowchart of an exemplary method of detecting contamination.

FIG. 3 depicts a flowchart of an exemplary method 300 for detecting contamination on a reticle. In step 310, a first signature, of at least a portion of a reticle, is produced and recorded. A signature results from measuring a physical characteristic of at least a part of the reticle surface. A signature can be produced using an inspection technology such as intensity imaging, interferometry, holography, thermal imaging, or electrostatic measurement. Other inspection technologies can also be used to produce a signature.

As an example, in step 310, the reticle is scanned with electromagnetic radiation, from a source, to produce a signature in a form of a digital image. The electromagnetic radiation has a wavelength of substantially 266 nanometers, a deep ultraviolet wavelength, or another practical wavelength. In some instances, the radiation can be polarized. Further, the system magnification can be adjusted to adjust a projected image size. After interacting with the reticle, the electromagnetic radiation is subsequently detected by a detector that is coupled to a processor and a storage device. The detector can be a focal plane array, for example, a charge-coupled device (CCD) such as an electron-multiplying charge-coupled device (EMCCD). Optionally, the detection process operates in a time delay and integration (TDI) mode. Alternatively, the electromagnetic radiation can be detected with a photomultiplier tube or a CMOS active pixel sensor.

In step 320, a second signature, of at least the portion of the reticle, is produced. Step 320 starts at a later time than the start of step 310. Step 320 can be performed at a routine interval, such as after passage of a predetermined period of time, a predetermined period of reticle usage, a predetermined period of storage, or a combination of these factors. Performance of step 320 need not be periodic, and can be started at any time after starting step 310. The first signature and the second signature need not be of exactly the same region of the reticle, and need only include overlapping regions for comparison in step 330.

In step 330, the first signature and the second signature are compared to identify a difference between the first signature and the second signature. A difference between the signatures indicates contamination on the reticle. The quantity of contamination is also identified to determine if the quantity of contamination is significant enough to warrant further action. For example, the difference between the signatures indicates a presence of significant contamination if the difference indicates that the contamination will degrade imaging of the reticle pattern sufficiently to impair function of a circuit fabricated with the reticle. The quantity of contamination can also be considered significant if the difference between signatures indicates particles have a surface area greater than a surface area limit. The comparison result can also indicate a size and location of the contamination. If the quantity of contamination is significant, the reticle can be cleaned to reduce the quantity of contamination present.

Figure 4:
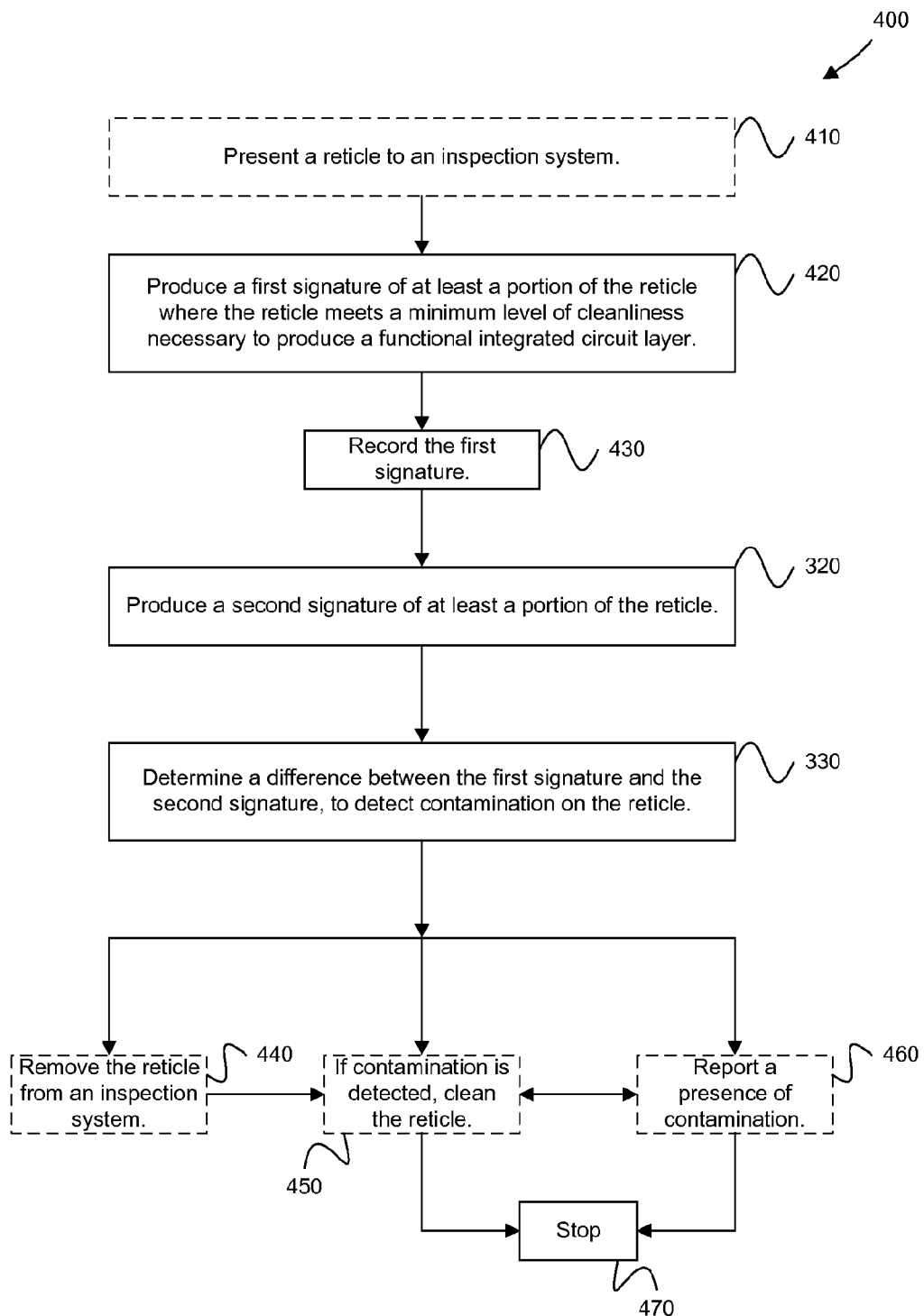
FIG. 4 depicts a flowchart of an exemplary method of detecting contamination using a known clean reticle.

FIG. 4 depicts a flowchart of an exemplary method 400 for detecting contamination using a known clean reticle. In FIG. 4, optional steps are illustrated with a dashed box. In step 410, the reticle is presented to the inspection system, such as an inspection module in a lithographic tool. The reticle can be a reflective reticle and can lack a protective pellicle.

In step 420, a first signature of at least a portion of the reticle is produced and recorded. The reticle meets a minimum level of cleanliness necessary to produce a functional circuit layer. For example, the first signature is produced by intensity imaging.

Steps 320 and 330 are performed subsequent to step 430. In step 320, a second signature of at least a portion of the reticle is produced. Like the first signature, the second signature can also be produced by intensity imaging. In step 330, the first signature and the second signature are compared to identify a difference between the first signature and the second signature. A difference between the first and second signatures indicates contamination on the reticle. Additional details about steps 320 and 330 are found elsewhere herein.

In step 440, the reticle is removed from the inspection system. In step 450, if contamination is detected, the reticle is cleaned. In step 460, presence of contamination on the reticle is reported. In step 470, the exemplary method 400 ends.

Figure 5:
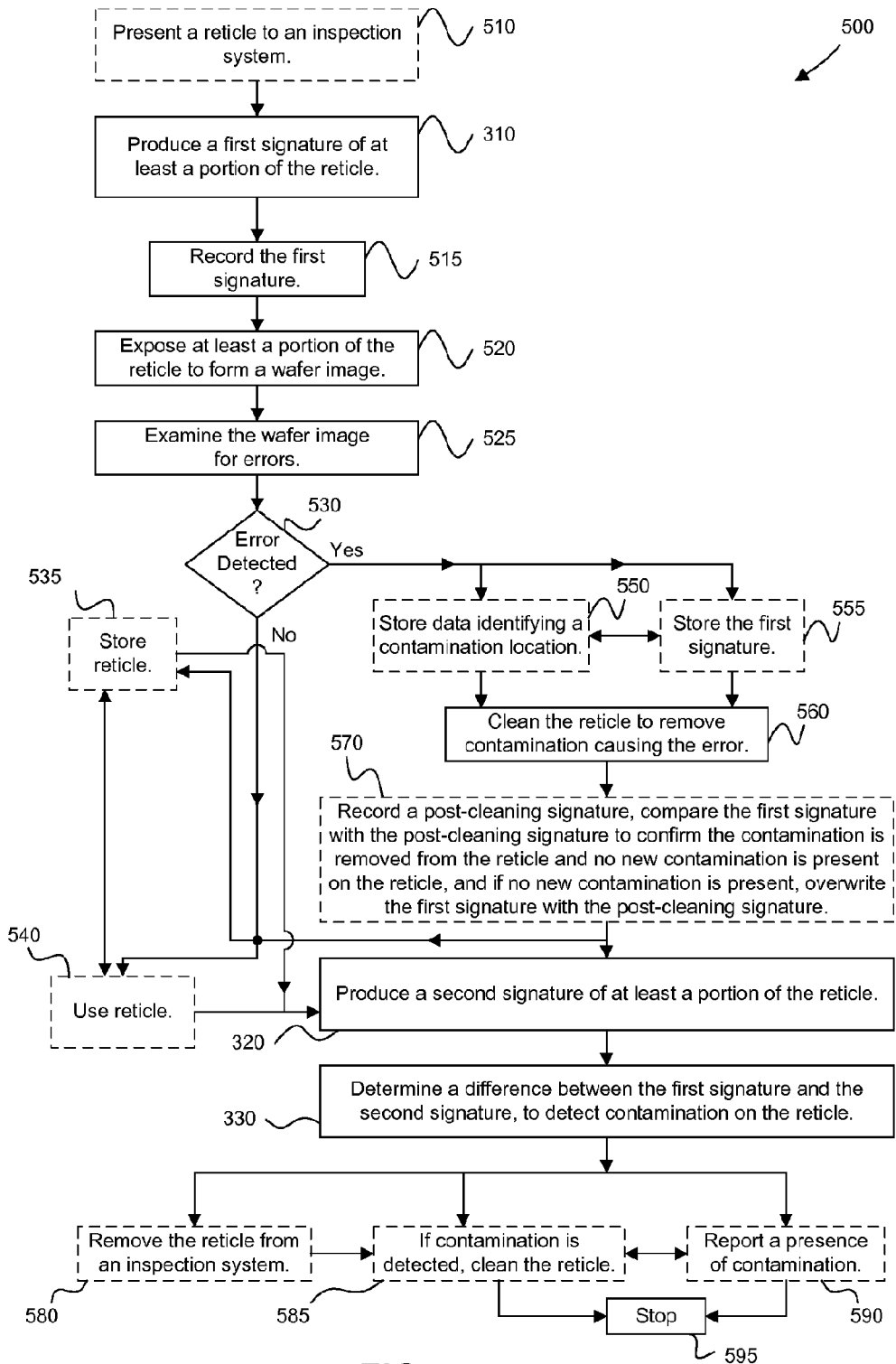
FIG. 5 depicts a flowchart of an exemplary method of detecting contamination including inspecting a reticle to determine the reticle's cleanliness.

FIG. 5 depicts a flowchart of an exemplary method 500 for detecting contamination including inspecting a reticle to determine the reticle's initial cleanliness. In FIG. 5, optional steps are illustrated with a dashed box. In step 510, the reticle is presented to an inspection system.

Step 310 is performed subsequent to step 510. In step 310, a first signature, of at least a portion of the reticle, is produced. Additional details about step 310 are found elsewhere herein.

In step 515, the first signature is recorded. In step 520, at least a portion of the reticle is exposed to form a wafer image. In step 525, the wafer image is examined to determine if there are any errors present in the image that suggest the reticle will produce a malfunctioning circuit layer. As shown in FIG. 5, step 530 is a decision block which determines a flowpath of the exemplary method 500 based upon the results of step 525.

In step 535, the reticle is stored, for example, in a reticle library. In step 540, the reticle is used. For example, the reticle is exposed to impart a pattern into the radiation beam B in the lithographic apparatus 100 or the lithographic apparatus 100'.

In step 550, data identifying a location of the contamination is stored. In step 555, the first signature is stored. In step 560, the reticle is cleaned to remove contamination causing the error.

In step 570, a post-cleaning signature is recorded. The first signature is then compared with the post-cleaning signature to confirm the contamination is removed from the reticle, and no new contamination is present on the reticle. If no new contamination is present, the first signature is overwritten with the post-cleaning signature. Accordingly, the post-cleaning signature becomes the first signature.

Steps 320 and 330 are performed subsequent to steps 540 and 570. In step 320, a second signature of at least a portion of the reticle is produced. In step 330, a difference between the first signature and the second signature is determined, to detect contamination on the reticle. Additional details about steps 320 and 330 are found elsewhere herein.

In step 580, the reticle is removed from the inspection system. In optional step 585, if contamination is detected, the reticle is cleaned. In optional step 590, presence of contamination on the reticle is reported. In step 595, the exemplary method 500 ends.

Figure 6:
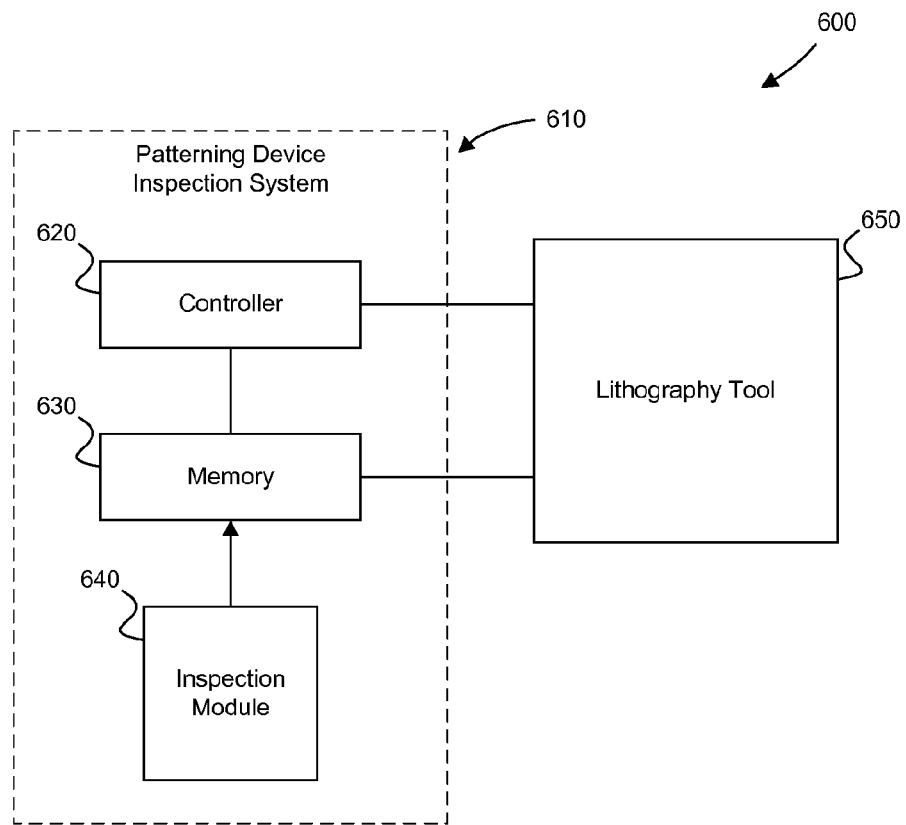
FIG. 6 depicts a contamination detection system.

FIG. 6 depicts a contamination detection system 600, which is configured to perform at least a part of the methods detailed herein. The contamination detection system 600 includes a patterning device inspection system 610, a lithography tool 650, a controller 620 that is coupled to a memory 630, and an inspection module 640.

IV. Conclusion

It is to be appreciated that the Summary and Abstract sections, as well as the Title, are not intended to limit the present invention and the claims. The Summary and Abstract sections may set forth one or more but not all exemplary embodiments of the present invention as contemplated by the inventor(s), and thus, are not intended to limit the present invention and the appended claims in any way.

The present invention has been described herein with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The foregoing description of specific embodiments fully reveals the general nature of the present invention so that others can, by applying knowledge within the skill of the art, readily modify and/or adapt such specific embodiments for various applications, without undue experimentation, and without departing from the general concept of the present invention. Therefore, such modifications and adaptations are intended to be within the meaning and range of equivalents of the disclosed embodiments, based on the teaching and guidance presented herein. The phraseology or terminology herein is for the purpose of description and not of limitation, such that the phraseology or terminology of this specification is to be interpreted by the skilled artisan in light of the teachings and guidance.

The breadth and scope of the present invention should not be limited by any of the above-described exemplary embodiments, but should be defined only in accordance with the claims and their equivalents.

What is claimed is:

1. A method for detecting contamination on a reticle, comprising:
   comparing a first signature of a portion of the reticle produced prior to cleaning the reticle with a second signature produced subsequent to cleaning the reticle in response to an error being detected in a wafer image formed from the reticle prior to cleaning, the comparing being performed to determine whether contamination is present on the cleaned reticle;
   in the absence of the contamination, overwriting the first signature with the second signature; and
   determining a difference between the first signature and a third signature, produced subsequent to the first signature, of the portion of the reticle.

2. The method of claim 1, further comprising:
   recording, prior to the comparing, the first signature.

3. The method of claim 2, further comprising:
   presenting the reticle to an inspection system prior to the recording.

4. The method of claim 2, further comprising:
   exposing the portion of the reticle to form a wafer image; and
   examining the wafer image to detect an error.

5. The method of claim 4, further comprising:
   if an error is detected,
      storing data identifying a contamination location; and
      storing the first signature.

6. The method of claim 4, further comprising:
   if no error is detected, inspecting, after the recording and after a predetermined period of use, the portion of the reticle to produce the second signature.

7. The method of claim 1, further comprising:
   producing the first signature and the second signature with a focal plane array operating in a time delay and integrate mode; or
   producing the first signature and the second signature by intensity imaging the portion of the reticle; or
   producing the first signature and the second signature by exposing the portion of the reticle with electromagnetic radiation having a deep ultraviolet wavelength; or
   producing the first signature and the second signature by exposing the portion of the reticle with polarized electromagnetic radiation; or
   producing the first signature and the second signature by measuring, with an interferometer, the portion of the reticle; or
   producing the first signature and the second signature by performing holography of the portion of the reticle; or
   producing the first signature and the second signature by measuring an electrostatic signature of the portion of the reticle; or
   producing the first signature and the second signature by measuring a thermal signature of the portion of the reticle; or
   producing the first signature and the second signature by measuring a capacitive signature of the portion of the reticle.

8. The method of claim 1, wherein the difference between the first signature and the second signature indicates a presence of contamination if the difference between the first signature and the second signature indicates that the contamination will degrade imaging of the reticle pattern sufficiently to impair function of a circuit.

9. The method of claim 8, wherein the difference between the first signature and the second signature indicates a presence of contamination if the difference between the first signature and the second signature indicates a presence of a particle having a surface area greater than a predetermined limit.

10. An apparatus constructed and arranged to detect contamination on a reticle, comprising:
    a controller; and
    memory coupled to the controller, the memory storing an inspection module configured to:
       compare a first signature of a portion of the reticle produced prior to cleaning the reticle with a second signature produced subsequent to cleaning the reticle in response to an error being detected in a wafer image formed from the reticle prior to cleaning, the comparing being performed to determine whether contamination is present on the cleaned reticle; and
       in the absence of the contamination, overwrite the first signature with the second signature.

11. A method for detecting contamination on a reticle, comprising:
    recording a first signature of a portion of the reticle;
    exposing the portion of the reticle to form a wafer image; and
    inspecting the wafer image to detect an error;
    in response to an error being detected, erasing the first signature and rejecting the reticle as contaminated; and
    if no error is detected, inspecting, after the recording, the portion of the reticle to produce a second signature; and
    determining a difference between the first signature and the second signature to detect contamination on the reticle.

12. A method for detecting contamination on a reticle, comprising:
  recording a first signature of a portion of the reticle produced prior to cleaning the reticle, wherein the reticle meets a minimum level of cleanliness necessary to produce a functional integrated circuit layer;
  comparing the first signature with a second signature produced subsequent to cleaning the reticle to determine whether contamination is present on the cleaned reticle; and
  in the absence of the contamination, overwriting the first signature with the second signature.

13. A patterning device inspection system for use in a lithography tool, the patterning device inspection system comprising:
  a controller; and
  memory coupled to the controller, the memory storing an inspection module configured to:
    detect contamination on a reticle by determining a difference between a first signature of a portion of the reticle produced prior to cleaning; the reticle and a second signature, produced subsequent to cleaning the reticle, of the portion of the reticle to determine whether contamination is present on the cleaned reticle; and
    in the absence of the contamination, overwrite the first, signature with the second signature.

14. The patterning device inspection system of claim 13, wherein the inspection module is configured to detect an error by examining a wafer image formed by exposing the portion of the reticle.

15. The patterning device inspection system of claim 14, wherein if an error is detected, the inspection module is configured to: store data identifying a contamination location in the memory; and store the first signature in the memory.

16. The patterning device inspection system of claim 14, wherein if no error is detected, the inspection module is configured to inspect, after a predetermined period of use, the portion of the reticle to produce the second signature.

17. The patterning device inspection system of claim 13, wherein the difference between the first signature and the second signature indicates a presence of contamination if the difference between the first signature and the second signature indicates that the contamination will degrade imaging of the reticle pattern sufficiently to impair function of a circuit.

18. The patterning device inspection system of claim 17, wherein the difference between the first signature and the second signature indicates a presence of contamination if the difference between the first signature and the second signature indicates a presence of a particle having a surface area greater than a predetermined limit.

* * * * *